(12) United States Patent
Tsuru et al.

(10) Patent No.: US 6,288,530 B1
(45) Date of Patent: Sep. 11, 2001

(54) APPARATUS AND METHOD FOR MEASURING RESONANCE FREQUENCY OF ELECTRIC CIRCUIT

(75) Inventors: Koji Tsuru, Iruma; Koushi Murata, Tokorozawa; Naobumi Suzuki, Mitaka; Hideki Nakajima, Kodaira, all of (JP)

(73) Assignee: Nippon and Telegraph and Telephone Corp., Tokyo (JP)

( * ) Notice: Subject to any disclaimer, the term of this patent is extended or adjusted under 35 U.S.C. 154(b) by 0 days.

(21) Appl. No.: 09/413,900

(22) Filed: Oct. 7, 1999

(30) Foreign Application Priority Data

Oct. 9, 1998 (JP) .................................................. 10-287736

(51) Int. Cl.[7] .......................... G01R 31/00; G01R 31/308
(52) U.S. Cl. ............................................. 324/96; 324/753
(58) Field of Search ............................... 324/96, 751, 752, 324/753, 763, 765, 759, 501

(56) References Cited

U.S. PATENT DOCUMENTS

| 4,394,617 | 7/1983 | Wampler ................................. 324/57 |
| 5,034,683 | * 7/1991 | Takahashi et al. .................... 324/753 |

FOREIGN PATENT DOCUMENTS

WO 96/00905    1/1996   (WO) .

OTHER PUBLICATIONS

"A Technique for Detecting Resonance", R.E. Laferty, IEEE Transactions on Instrumentation and Measurement, vol. 37, No. 2, Jun. 1988, p. 326.*

K. Tsuru, et al. "Measurement of the Resonance Frequency of Contactless IC Cards Using an EOS Probe," *Technical Report IEICE*, CS99–33, RCS99–25, pp. 1–5, Jun., 1999.

K. Tsuru, et al., "Measurement of the Resonance Frequency of Contactless IC Cards Using an Electro–Optic–Sampling Probe," SBMO/IEEE IMOC'99, pp. 1–3, Aug., 1999.

Lafferty, R. E., "A Technique for Detecting Resonance," I.E.E.E. Transactions on Instrumentation and Measurement, New York, vol. 37, No. 2, (Jun. 1988), p. 326.

* cited by examiner

*Primary Examiner*—Glenn W. Brown
*Assistant Examiner*—Anjan K Deb
(74) *Attorney, Agent, or Firm*—Burns Doane Swecker & Mathis

(57) ABSTRACT

A method and apparatus for measuring the resonance frequency of an electric circuit with low disturbance and high accuracy is disclosed. An electrooptic crystal, whose refractive index changes according to the strength of an applied electric field, is used as a sensor, and a frequency-sweep electromagnetic wave is applied to a resonance section of an electric circuit from an external device. The induced current flowing in the resonance section generates an electric field, which is detected by measuring the refractive index of the electrooptic crystal in the form of the relevant light intensity. The resonance frequency is determined based on the maximum electric field strength.

3 Claims, 4 Drawing Sheets

APPARATUS AND METHOD FOR MEASURING RESONANCE FREQUENCY OF ELECTRIC CIRCUIT

BACKGROUND OF THE INVENTION

1. Field of the Invention

The present invention relates to a method and apparatus for measuring the resonance frequency of an electric circuit with no undesirable influences or disturbances on the circuit. According to the measurement of the present invention, the resonance frequency, an important parameter for evaluating the circuit, can be determined with low disturbance and high accuracy, so that the present invention greatly contributes to the information/communication and electronics industries.

This application is based on Patent Applications No. Hei 10-287736 filed in Japan, the contents of which are incorporated herein by reference.

2. Description of the Related Art

Generally, a resonance circuit of an electric circuit is designed based on calculated results of the reactance and capacitance of the circuit. However, in most cases, the practical resonance frequency is different from the design value due to the dispersion of characteristics of each element included in the circuit, or to floating capacitance.

Conventionally, an electrically-systemized method has been employed for measuring the resonance frequency, in which a frequency-sweep electromagnetic wave is applied to the resonance section in the target electric circuit, and related reflection or the electric field induced in the resonance section is then measured using a coil. Therefore, the measuring apparatus electrically influences the measured section, and the measured frequency may be different from the real value.

SUMMARY OF THE INVENTION

In consideration of these circumstances, the present invention has an objective to provide a method and apparatus for measuring the resonance frequency of an electric circuit with low disturbance and high accuracy.

Therefore, the present invention provides a method of measuring the resonance frequency of an electric circuit having a resonance section, the method using an electrooptic crystal, whose refractive index changes according to the strength of an applied electric field, as a sensor for detecting a change of an electric field, and the method comprising the steps of:

applying a frequency-sweep electromagnetic wave to the resonance section of the electric circuit from an external device, so as to induce a current flowing in the resonance section;

measuring a change of the refractive index of the electrooptic crystal in the form of a corresponding change of light intensity;

detecting the change of the strength of the electric field with reference to the measured change of the refractive index, and determining the resonance frequency of the electric circuit based on the maximum value of the strength of the electric field.

In the above method, any one of an oxide of a trigonal crystal, a compound semiconductor of a cubic crystal system, and a single crystal oxide of a cubic crystal system may be used as the electrooptic crystal.

The present invention also provides an apparatus for measuring the resonance frequency of an electric circuit having a resonance section, comprising:

frequency sweep means for generating a frequency sweep signal;

electromagnetic wave supply means, to which the frequency sweep signal is supplied from the frequency sweep means, for generating and externally applying a frequency-sweep electromagnetic wave to the resonance section of the electric circuit, so as to induce a current flowing in the resonance section;

electric field strength measuring means having and using an electrooptic crystal, whose refractive index changes according to the strength of an electric field generated by the induced current, as a sensor for detecting the electric field;

data processing means for determining the resonance frequency of the electric circuit based on the maximum value of the measured strength of the electric field; and display means for image-displaying the resonance frequency obtained by the data processing means.

According to the present invention, the resonance frequency of an electric circuit is measured using an optic effect so that highly accurate measurement can be performed. In addition, a frequency-sweep electromagnetic wave is applied to the resonance section from an external device; thus, the resonance frequency can be measured with a very simple system arrangement. Furthermore, a very small crystal which is subject to the Pockels effect (an electrooptic effect) is used, thereby performing the measurement with no influence on the electric circuit (to be measured) as a dielectric conductor.

Consequently, the resonance frequency, an important parameter of the electric circuit, can be determined with low disturbance and high accuracy.

DESCRIPTION OF THE PREFERRED EMBODIMENTS

Hereinbelow, embodiments according to the present invention will be explained.

Figure 1:
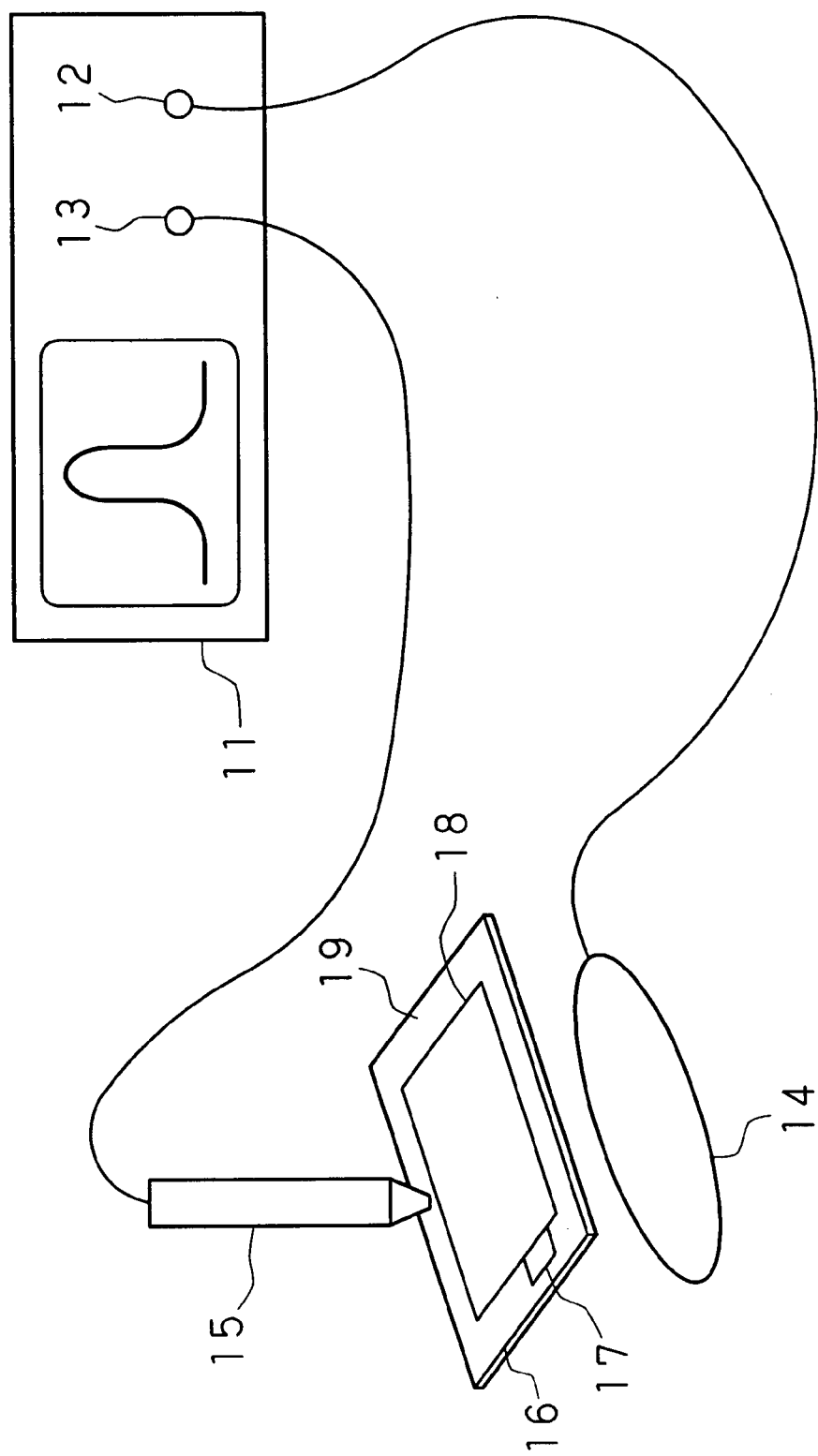
FIG. 1 is a diagram showing a system arrangement related to an embodiment according to the present invention.

FIG. 1 is a diagram showing the system arrangement related to an embodiment according to the present invention.

In the figure, reference numeral 11 indicates a resonance-frequency measuring apparatus which includes high-frequency sweep terminal 12 and electric-field measuring probe terminal 13. An electromagnetic-wave supply loop antenna 14 is connected to the high-frequency sweep terminal 12, and an electric-field measuring probe 15 is connected to the electric-field measuring probe terminal 13. A non-contact IC (integrated circuit) card 16 is placed between the electromagnetic-wave supply loop antenna 14 and the electric-field measuring probe 15.

The above non-contact IC card 16 comprises an IC 17 and a loop antenna 18 for receiving energy transmitted from an external device and for transmitting/receiving information. These IC 17 and loop antenna 18 are covered with an IC card packing material (nonmetal) such as PET (polyethylene terephthalate), a polymer insulating material, and there is no electrode for electrically transmitting or receiving to or from an external device in a contact state provided in the IC card.

When an electromagnetic wave is applied to the non-contact IC card 16 from an external device, an induced current is generated in the loop antenna 18, thereby generating an AC (alternating current) electric field around the loop antenna 18. This AC electric field is measured using the electric-field measuring probe 15 connected to the resonance-frequency measuring apparatus 11.

Figure 2:
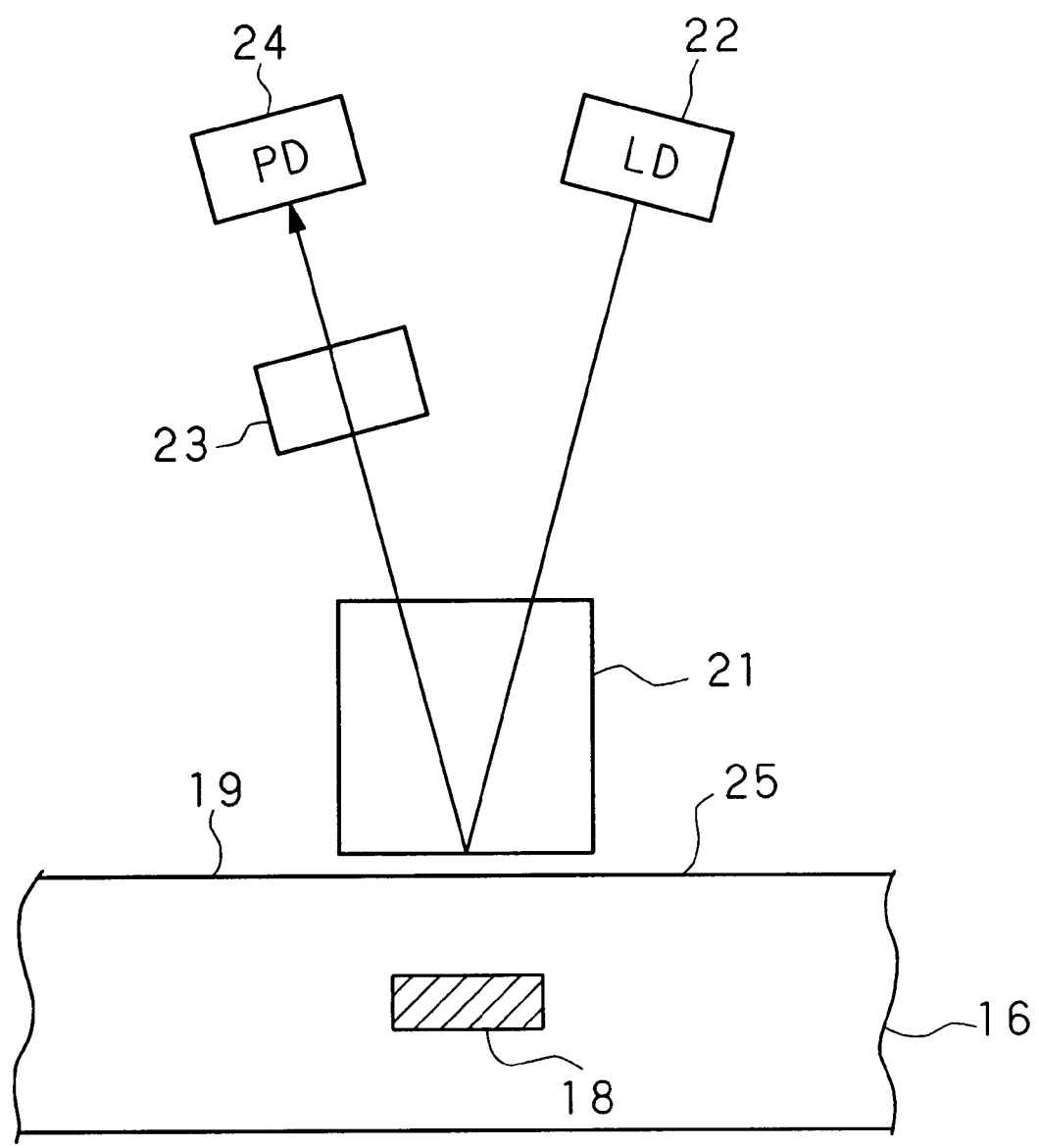
FIG. 2 is a diagram explaining the principle and system arrangement of the measurement using an electrooptic crystal in the electric-field measuring probe in the embodiment.

As shown in FIG. 2, this electric-field measuring probe 15 includes an electrooptic crystal 21 whose (complex) refractive index is changed according to the external electric field. The electrooptic crystal 21 is irradiated by a laser beam from laser diode (LD) 22, and a specific plane of polarization of the reflected beam (of the laser beam) is detected using analyser 23 so as to measure a change of the relevant light intensity (of the laser beam) by using a photodiode (PD: an element for detecting the light intensity) 24. That is, the change of the refractive index is detected in the form of the corresponding change of the light intensity, so as to determine (the change of) the strength of the electric field (i.e., the electric field strength). In FIG. 2, reference numeral 25 indicates the surface of the non-contact IC card 16.

The above type of device for measuring the electric field strength, using an electrooptic crystal, is known, but has only been used for nondestructive inspection of an element or wiring. In the present invention, the resonance frequency, a physical quantity which does absolutely not relate to the nondestructive inspection, is determined by using the electric-field measuring probe 15, the resonance-frequency measuring apparatus 11 which includes a high-frequency sweep section, and the electromagnetic-wave supply loop antenna 14. In the present embodiment, the electrooptic crystal is $Bi_4Si_3O_{12}$ (BSO).

Figure 3:
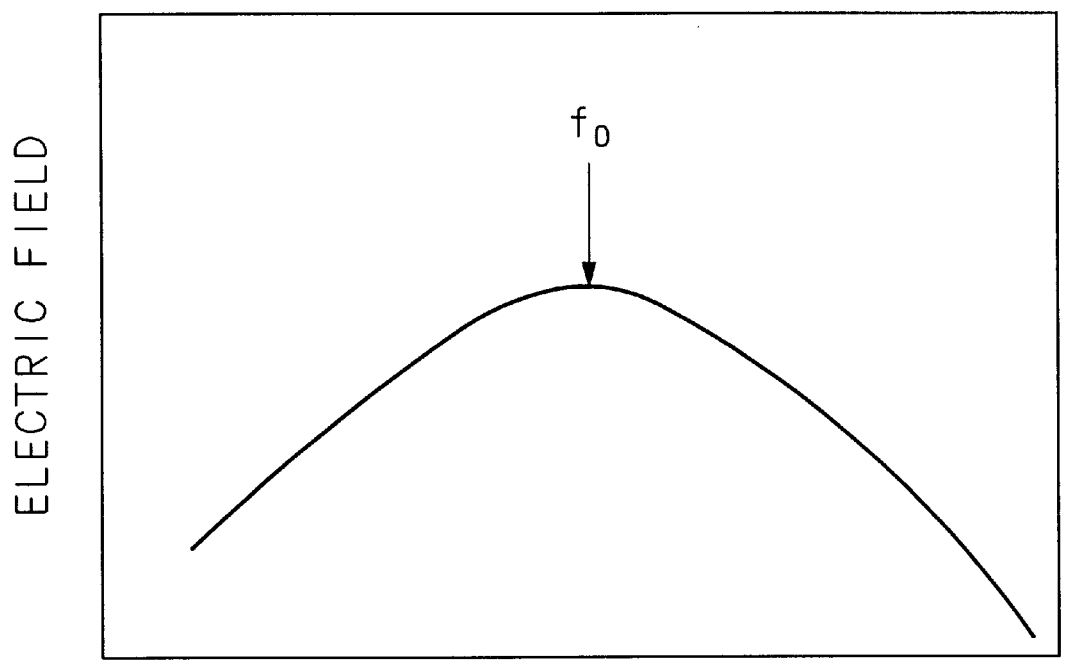
FIG. 3 is a graph diagram showing the characteristic relationship between the sweep electromagnetic wave and the electric field, as example results measured using the system shown in FIG. 1

In order to determine the resonance frequency of the non-contact IC card 16, a high-frequency wave is supplied from the high-frequency sweep terminal 12 of the resonance-frequency measuring apparatus 11 as shown in FIG. 1, so that the supplied wave is applied to the non-contact IC card 16. In this way, the strength of the induced electric field around the electromagnetic-wave supply loop antenna 14 is detected using the electric-field measuring probe 15 whose (measuring) position is predetermined and fixed. As shown in FIG. 3, in the frequency of the applied electromagnetic wave (i.e., sweep signal), the resonance frequency $f_0$ of the non-contact IC card 16 corresponds to the maximum value of the electric field.

Figure 4:
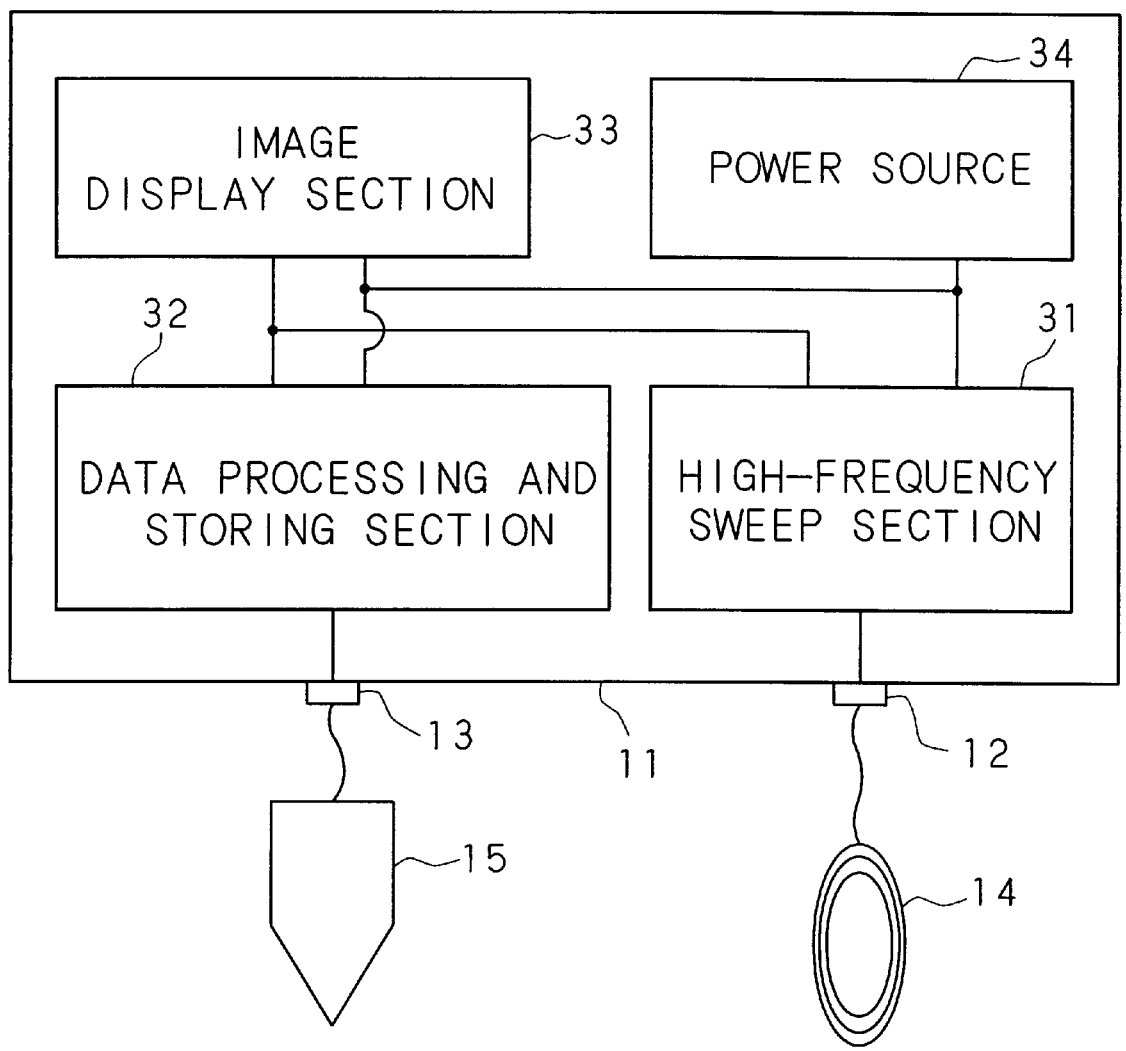
FIG. 4 is a diagram showing the internal structure of the resonance-frequency measuring apparatus in the embodiment.

FIG. 4 shows the internal structure of the resonance-frequency measuring apparatus 11 (applicable to various electric circuits).

In the structure, the high-frequency sweep terminal 12, to which the electromagnetic-wave supply loop antenna 14 is connected, is connected to high-frequency sweep section 31. The frequency-sweep signal (having a high frequency) generated by the high-frequency sweep section 31 is supplied to the electromagnetic-wave supply loop antenna 14, from which a frequency-sweep electromagnetic wave is emitted.

The electric-field measuring probe terminal 13, to which the electric-field measuring probe 15 is connected, is connected to data processing and storing section 32. This section 32 processes and stores data sent from the electric-field measuring probe 15, and makes the processed data shown in image display section 33. Electric power is supplied from power source 34 to the high-frequency sweep section 31, data processing and storing section 32, and image display section 33.

That is, in the present embodiment, the electric-field measuring probe 15 employs the electrooptic crystal 21 (whose refractive index changes depending on the electric field strength) as a sensor, and a frequency-sweep electromagnetic wave from the electromagnetic-wave supply loop antenna 14 is applied (i.e., from an external device) to the resonance section of a target electric circuit. In addition, the strength of the electric field generated by the induced current flowing in the resonance section of the electric circuit is measured with reference to the relevant change of the light intensity, which corresponds to the change of the refractive index of the electrooptic crystal 21 in the probe 15, and the resonance frequency is determined based on the maximum value of the electric field.

In order to prevent electrical effects (by the measurement) on the target electric circuit to be measured, in the present embodiment, a laser beam is radiated onto a very small electrooptic crystal and the relevant reflection is measured, thereby detecting the change of the refractive index of the electrooptic crystal and determining the electric field strength. In addition, an electromagnetic wave is externally applied to the resonance section of the electric circuit, and the electric field strength of the induced current flowing the relevant internal circuit is measured, so that the frequency corresponding to the maximum electric field strength is determined as the resonance frequency of the electric circuit to be measured. That is, according to the measurement based on the present invention, a value almost the same as the true resonance frequency of the target electric circuit can be obtained.

As the electrooptic crystal whose refractive index changes according to the electric field strength, it is possible to use an oxide of a trigonal crystal system such as $LiNbO_3$ or $LiTaO_3$, a compound semiconductor of a cubic crystal system such as ZnS or ZnTe, or a single crystal oxide of a cubic crystal system such as $Bi_4Si_3O_{12}$ or $Bi_4Ge_3O_{12}$.

The present invention is not limited to the above embodiment, but any modification within the spirit and scope of each claim is possible. In addition, a component included in the above embodiment may be omitted in a modified variation if unnecessary.

What is claimed is:

1. A method of measuring the resonance frequency of an electric circuit having a resonance section, the method using an electrooptic crystal, whose refractive index changes according to the strength of an applied electric field, as a sensor for detecting a change of an electric field, and the method comprising the steps of:

applying a frequency-sweep electromagnetic wave to the resonance section of the electric circuit from an external device, so as to induce a current flowing in the resonance section;

measuring a change of the refractive index of the electrooptic crystal in the form of a corresponding change of light intensity;

detecting the change of the strength of the electric field with reference to the measured change of the refractive index, and determining the resonance frequency of the electric circuit based on the maximum value of the strength of the electric field.

2. A method as claimed in claim 1, wherein any one of an oxide of a trigonal crystal, a compound semiconductor of a cubic crystal system, and a single crystal oxide of a cubic crystal system is used as the electrooptic crystal.

3. An apparatus for measuring the resonance frequency of an electric circuit having a resonance section, comprising:

frequency sweep means for generating a frequency sweep signal;

electromagnetic wave supply means, to which the frequency sweep signal is supplied from the frequency sweep means, for generating and externally applying a frequency-sweep electromagnetic wave to the resonance section of the electric circuit, so as to induce a current flowing in the resonance section;

electric field strength measuring means having and using an electrooptic crystal, whose refractive index changes according to the strength of an electric field generated by the induced current, as a sensor for detecting the electric field;

data processing means for determining the resonance frequency of the electric circuit based on the maximum value of the measured strength of the electric field; and display means for image-displaying the resonance frequency obtained by the data processing means.

* * * * *